(12) United States Patent
Gudgel

(10) Patent No.: US 10,727,616 B2
(45) Date of Patent: Jul. 28, 2020

(54) DIN RAIL MOUNTING BRACKET

(71) Applicant: Hubbell Incorporated, Shelton, CT (US)

(72) Inventor: Cody Wayne Gudgel, Litchfield, IL (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 16/150,978

(22) Filed: Oct. 3, 2018

(65) Prior Publication Data

US 2019/0103685 A1 Apr. 4, 2019

Related U.S. Application Data

(60) Provisional application No. 62/567,486, filed on Oct. 3, 2017.

(51) Int. Cl.
| | |
|---|---|
| *H01R 9/26* | (2006.01) |
| *H01R 9/24* | (2006.01) |
| *H02B 1/052* | (2006.01) |
| *H05K 7/18* | (2006.01) |
| *H01R 25/14* | (2006.01) |
| *H01R 4/64* | (2006.01) |

(52) U.S. Cl.
CPC ............ *H01R 9/24* (2013.01); *H01R 9/2608* (2013.01); *H01R 4/64* (2013.01); *H01R 9/26* (2013.01); *H01R 25/14* (2013.01); *H01R 25/142* (2013.01); *H02B 1/052* (2013.01); *H05K 7/183* (2013.01)

(58) Field of Classification Search
CPC ................................ H02B 1/052; H05K 7/183

USPC ............................ 439/716, 121, 94, 110, 532
See application file for complete search history.

(56) References Cited

U.S. PATENT DOCUMENTS

| | | | | |
|---|---|---|---|---|
| 4,707,563 A | * | 11/1987 | Conrad | H05K 5/0247 174/50 |
| 6,802,737 B2 | * | 10/2004 | Bergner | H01R 9/2658 439/532 |
| 8,715,017 B1 | * | 5/2014 | Barber | H01R 9/2408 439/716 |
| 2011/0269339 A1 | * | 11/2011 | Baran | H05K 7/1474 439/532 |

* cited by examiner

*Primary Examiner* — Abdullah A Riyami
*Assistant Examiner* — Justin M Kratt
(74) *Attorney, Agent, or Firm* — Michael Best & Friedrich, LLP

(57) ABSTRACT

An electrical block mounting assembly includes a bracket, an electrical block assembly, and a rail. The bracket includes a first surface and a second surface that is opposite the first surface. The bracket also includes a first securing member and a second securing member, which are coupled to the second surface. The electrical block assembly is coupled to the bracket. The electrical block assembly includes at least one electrical block. The first electrical block is coupled to the second electrical block in a coupling direction. The rail extends along a rail axis and is coupled to the bracket by the first securing member and the second securing member such that the coupling direction is orthogonal to the rail axis.

19 Claims, 13 Drawing Sheets

DIN RAIL MOUNTING BRACKET

CROSS-REFERENCE TO RELATED APPLICATION

This application claims benefit of prior-filed, U.S. Provisional Patent Application No. 62/567,486, filed Oct. 3, 2017, the entire contents of which are incorporated by reference herein.

FIELD

Various exemplary embodiments relate to a mounting bracket, and more specifically to a mounting bracket and electrical block arrangement.

BACKGROUND

Terminal blocks are used to connect two or more electrical conductors in a variety of environments. Terminal blocks are used to transfer power from primary conductors to secondary tap conductors of different sizes. The end of a primary conductor is stripped of insulation and inserted into a first port of a terminal block. The ends of one or more secondary tap conductors are similarly stripped of insulation and inserted into separate, respective tap ports. Electricity is transferred from the primary conductor to the secondary tap conductors through the terminal block, which can be mounted on DIN rails while in use.

SUMMARY

In one aspect, an electrical block mounting assembly includes a bracket, an electrical block assembly, and a rail. The bracket includes a first surface and a second surface that is opposite the first surface. The bracket also includes a first securing member and a second securing member, which are coupled to the second surface. The electrical block assembly is coupled to the bracket. The electrical block assembly includes at least one electrical block. The first electrical block is coupled to the second electrical block in a coupling direction. The rail extends along a rail axis and is coupled to the bracket by the first securing member and the second securing member such that the coupling direction is orthogonal to the rail axis.

Another aspect includes, a bracket for mounting an electrical block mounting assembly, the electrical block mounting assembly includes a first terminal block, a second terminal block, and a rail. The first terminal block and the second terminal block are connected along a connection direction and coupled to the rail such that the connection direction is orthogonal to the rail. The bracket includes a first surface configured to couple to the first terminal block and the second terminal block. The bracket also includes a second surface opposite the first surface. A first securing member and a second securing member are coupled to the second surface. The first securing member includes a projection that is moveable relative the second surface. The first securing member and the second securing member are configured to couple to the rail.

In yet another aspect, a bracket for mounting an electrical block mounting assembly, the electrical block mounting assembly includes a first terminal block, a second terminal block, and a rail. The first terminal block and the second terminal block are connected along a connection direction and coupled to the rail such that the connection direction is orthogonal to the rail. The bracket includes a first surface configured to couple to the first terminal block and the second terminal block. The bracket also includes a second surface opposite the first surface. A first securing member and a second securing member are coupled to the second surface. The securing members are L-shaped and each securing member includes a securing surface. The first securing member includes an arcuate portion configured to allow the first securing member to bend.

BRIEF DESCRIPTION OF THE DRAWINGS

The aspects and features of various exemplary embodiments will be more apparent from the description of those exemplary embodiments taken with reference to the accompanying drawings, in which.

DETAILED DESCRIPTION OF EXEMPLARY EMBODIMENTS

Before any embodiments are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Also, it is to be understood that the phraseology and terminology used herein is for the purpose of description and should not be regarded as limiting. Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof. Unless specified or limited otherwise, the terms "mounted," "connected," "supported," and "coupled" and variations thereof are used broadly and encompass both direct and indirect mountings, connections, supports, and couplings.

In general, the present disclosure relates to a bracket for mounting a terminal block onto a rail. The bracket mounts the block perpendicular to the rail.

Figure 1:
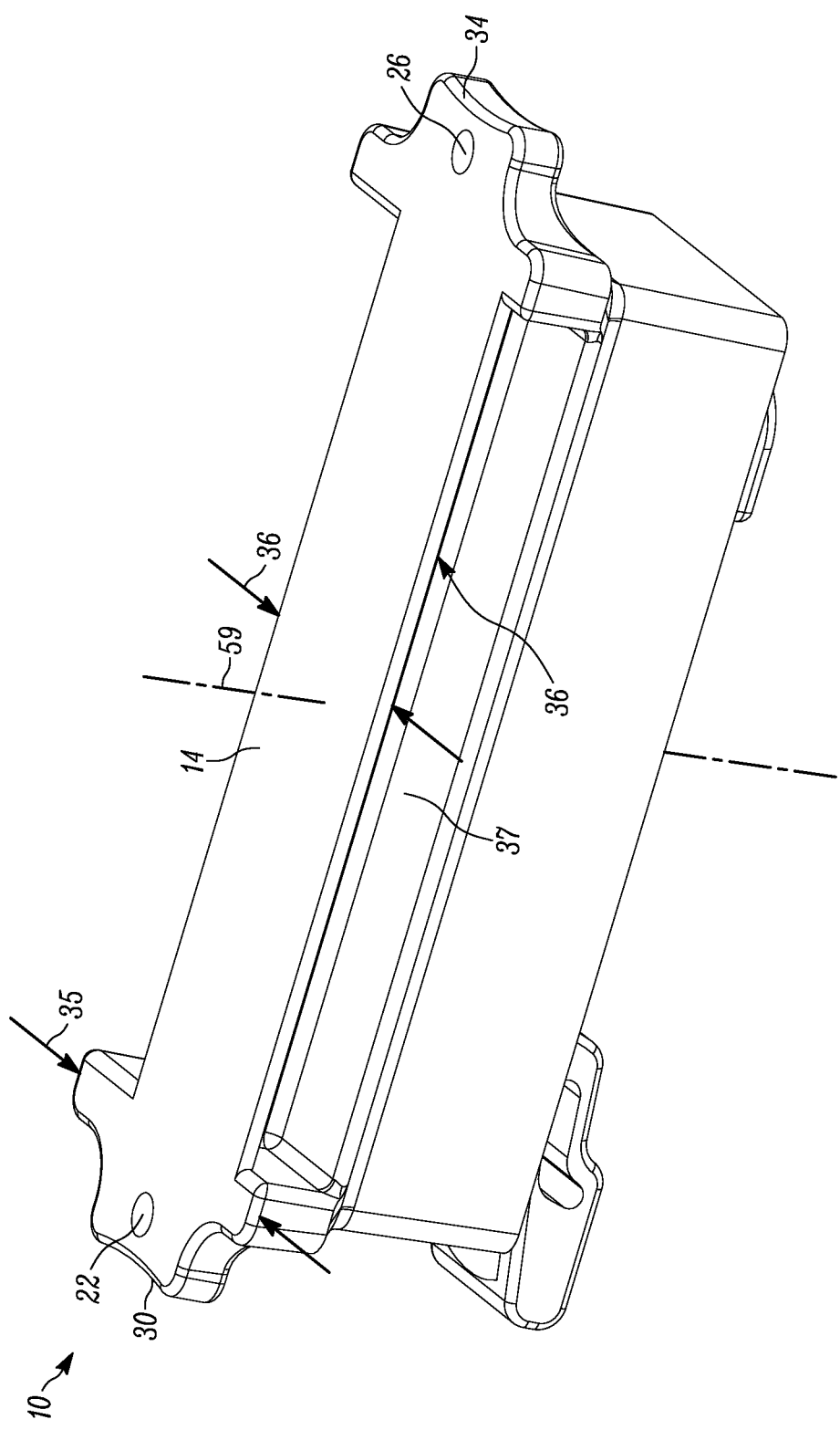
FIG. 1 is a perspective view of a bracket.
Figure 2:
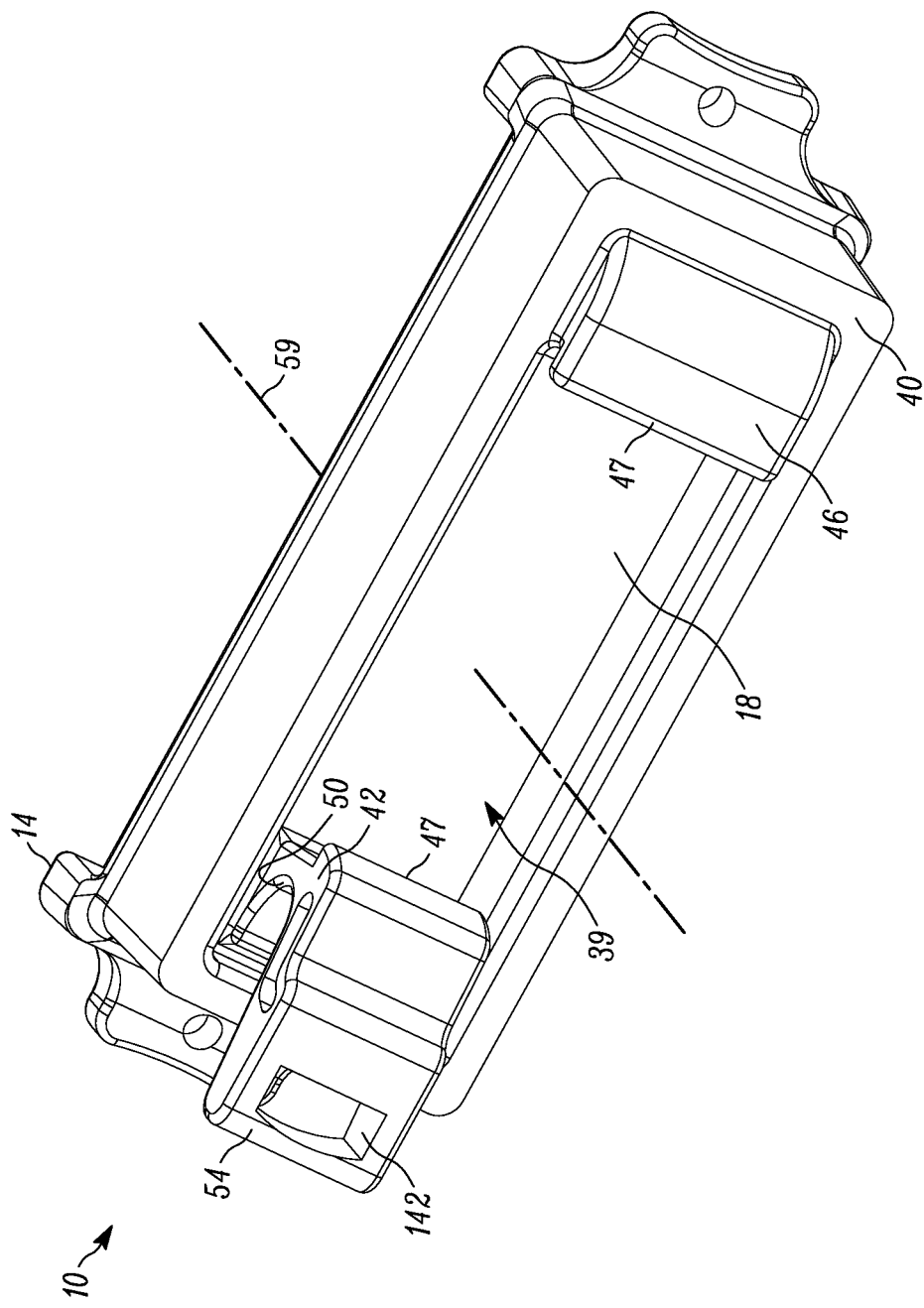
FIG. 2 is a bottom perspective view of the bracket of FIG. 1.

In accordance with an exemplary embodiment, FIG. 1 shows a bracket 10. In the illustrated embodiment, the bracket 10 includes surfaces that are generally rectangular in shape and oriented orthogonal with respect to one another. Though in other embodiments (not shown), the surfaces can consist of other shapes and the surfaces do not have to be orthogonal. In the embodiment shown, the bracket 10 is formed by injection molding. In additional embodiments, the bracket 10 can be formed using other methods. The bracket 10 includes a first or upper surface 14 and a second or lower surface 18 (FIG. 2). The upper surface 14 is opposite the lower surface 18. The upper surface 14 and the lower surface 18 define two of the exterior surfaces of the bracket 10. The upper surface 14 includes a first aperture 22 and a second aperture 26. The first aperture 22 and the second aperture 26 are located proximate a first edge 30 and a second edge 34 of the upper surface 14, respectively.

Figure 4:
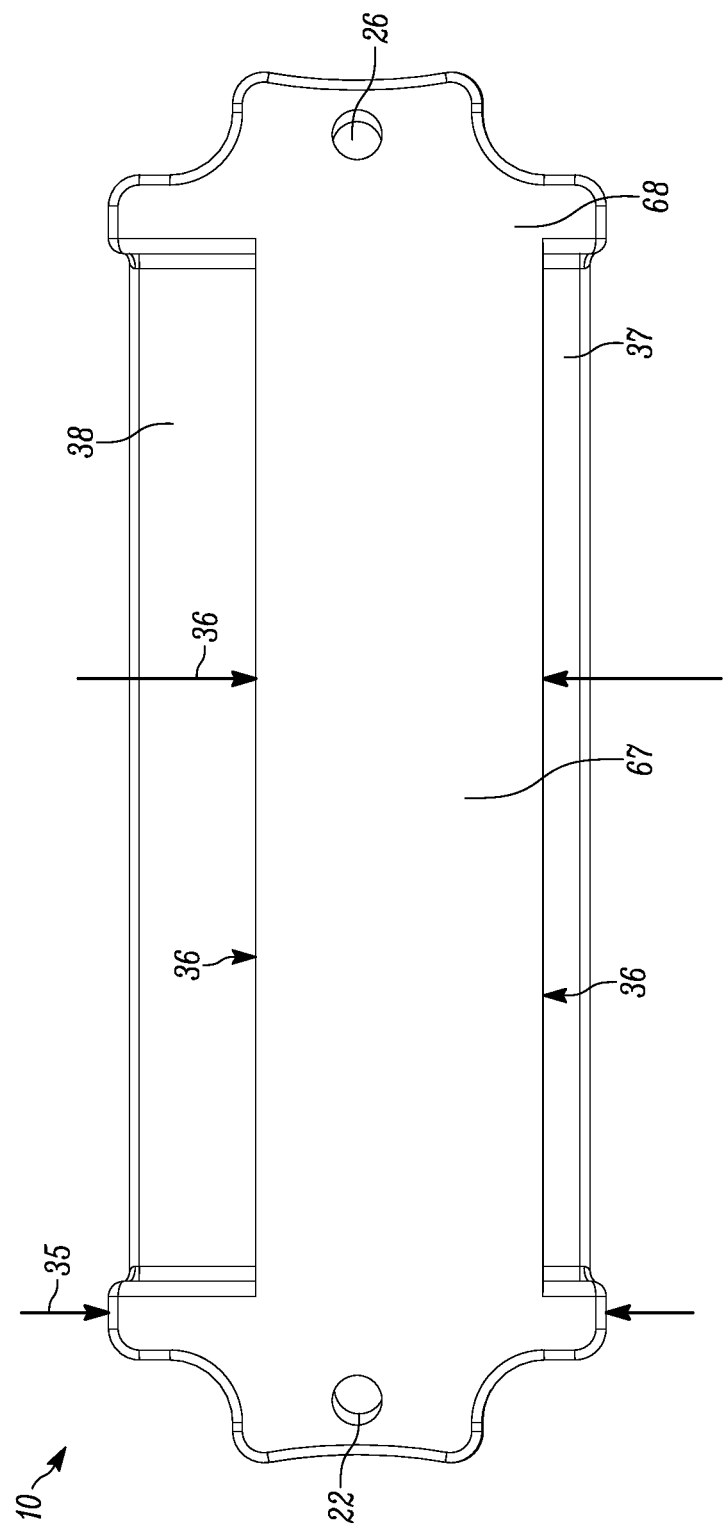
FIG. 4 is a top view of the bracket of FIG. 1.

In the illustrated embodiment, the upper surface 14 includes a first width 35 and a second width 36. The second width 36 is narrower that the first width 35. Below the upper surface 14 is a first ledge surface 37 and a second ledge surface 38 (FIG. 4). In the illustrated embodiment, a distance between an outer edge of the first ledge surface 37 and an outer edge of the second ledge surface 38 is equal to the first width 35. The first ledge surface 37 and the second ledge surface 38 are parallel to the upper surface 14 and the lower surface 18.

FIG. 2 shows the bottom perspective of the bracket 10. In the illustrated embodiment, the lower surface 18 is formed in a recess 39. A third surface 40 defines an edge of the recess 39. The recess 39 is substantially rectangular in shape and extends through the bracket 10 towards the upper surface 14. A first securing member 42 and a second securing member 46 are coupled to the lower surface 18. The first securing member 42 and the second securing member 46 extend from the lower surface 18 out of the recess 39, and past the third surface 40. The first and second securing members 42, 46 protrude in a direction generally away from the upper surface 14. In the illustrated embodiment, first securing member 42 and second securing member 46 each include an L-shaped section 47. The L-shaped sections 47 of the first securing member 42 and the second securing member 46 are directed towards an axis 59, which passes through a center of the lower surface 18.

The first securing member 42 also includes an arcuate portion 50. The arcuate portion 50 is opposite the L-shaped section 47 of the first securing member 42 and is open toward the first edge 30. The arcuate portion 50 is formed with a projection 54 that extends past an edge of the third surface 40. In the illustrated embodiment, the projection 54 is moveable with respect to the lower surface 18 via the arcuate portion 50.

Figure 3:
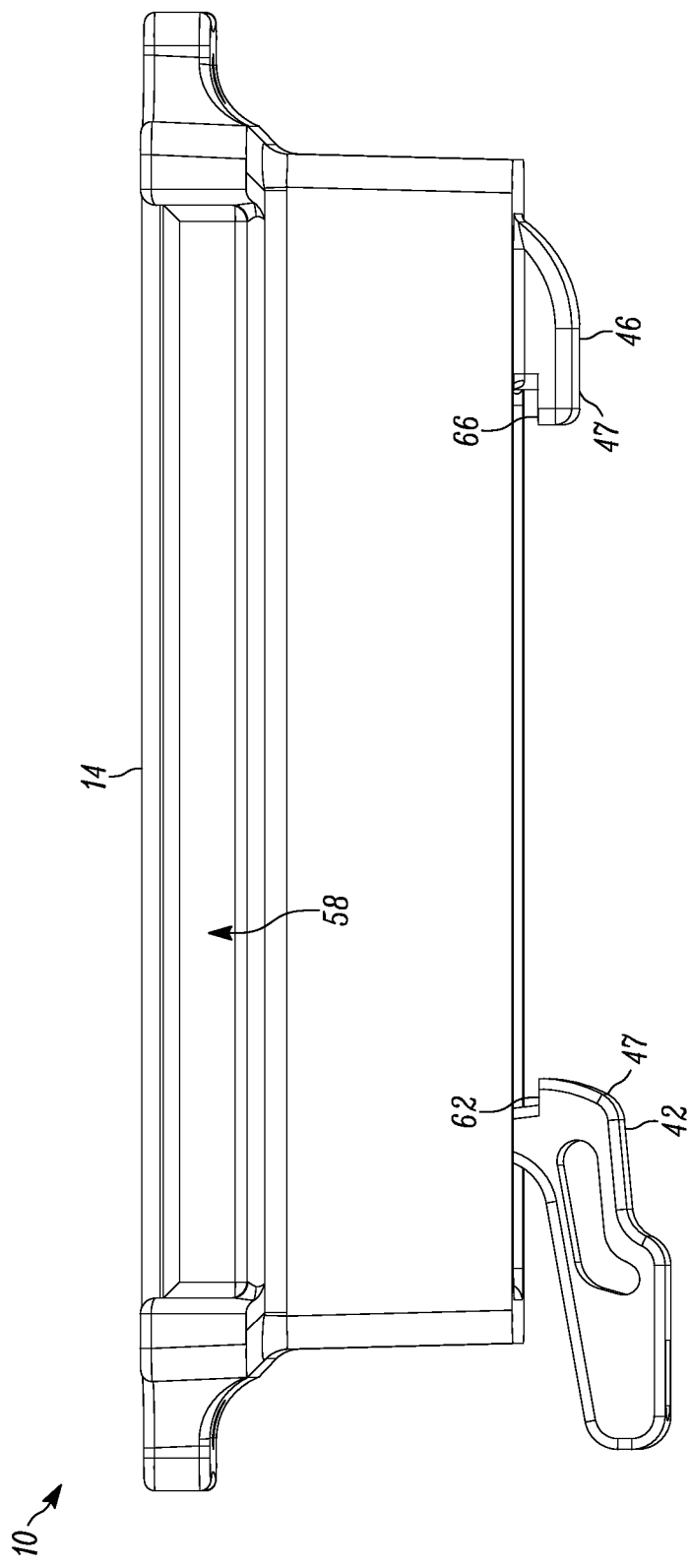
FIG. 3 is a front view of the bracket of FIG. 1.

Referring to FIG. 3, the bracket 10 includes a first ledge recess 58, and it is understood that a similar second ledge recess (not shown) is positioned on an opposite side of the bracket 10. The first ledge recess 58 and the second ledge recess extend into the bracket 10 towards a longitudinal center plane that passes through the axis 59 and apertures 22, 26. In the illustrated embodiment, the first ledge recess 58 and the second ledge recess have substantially rectangular profiles.

A first securing surface 62 on the L-shaped section 47 of the first securing member 42 and a second securing surface 66 on the L-shaped section 47 of the second securing member 46 are located on a shared plane. This allows the bracket 10 to couple to a member with a flat surface. In other embodiments, the first securing surface 62 and the second securing surface 66 may be located on different planes, so that the bracket 10 can couple to different shaped surfaces.

FIG. 4 shows the top view of the bracket 10. In the illustrated embodiment, a first section 67 of the upper surface 14 is off center from a second section 68 of the upper surface 14. In other words, a center of a portion of the upper surface 14 having the second width 36 is offset or not aligned with an axis extending between the first aperture 22 and the second aperture 26. In this configuration, the first ledge surface 37 has an area less than an area of the second ledge surface 38. In other embodiments, the center of the portion of the upper surface 14 having the second width 36 can be aligned with an axis extending between the first aperture 22 and the second aperture 26. In this way, the portion of the upper surface 14 having the second width 36 would be in line with the portion of the upper surface 14 having the first width 35, and the first ledge surface 37 and the second ledge surface 38 would have the same area.

Figure 5:
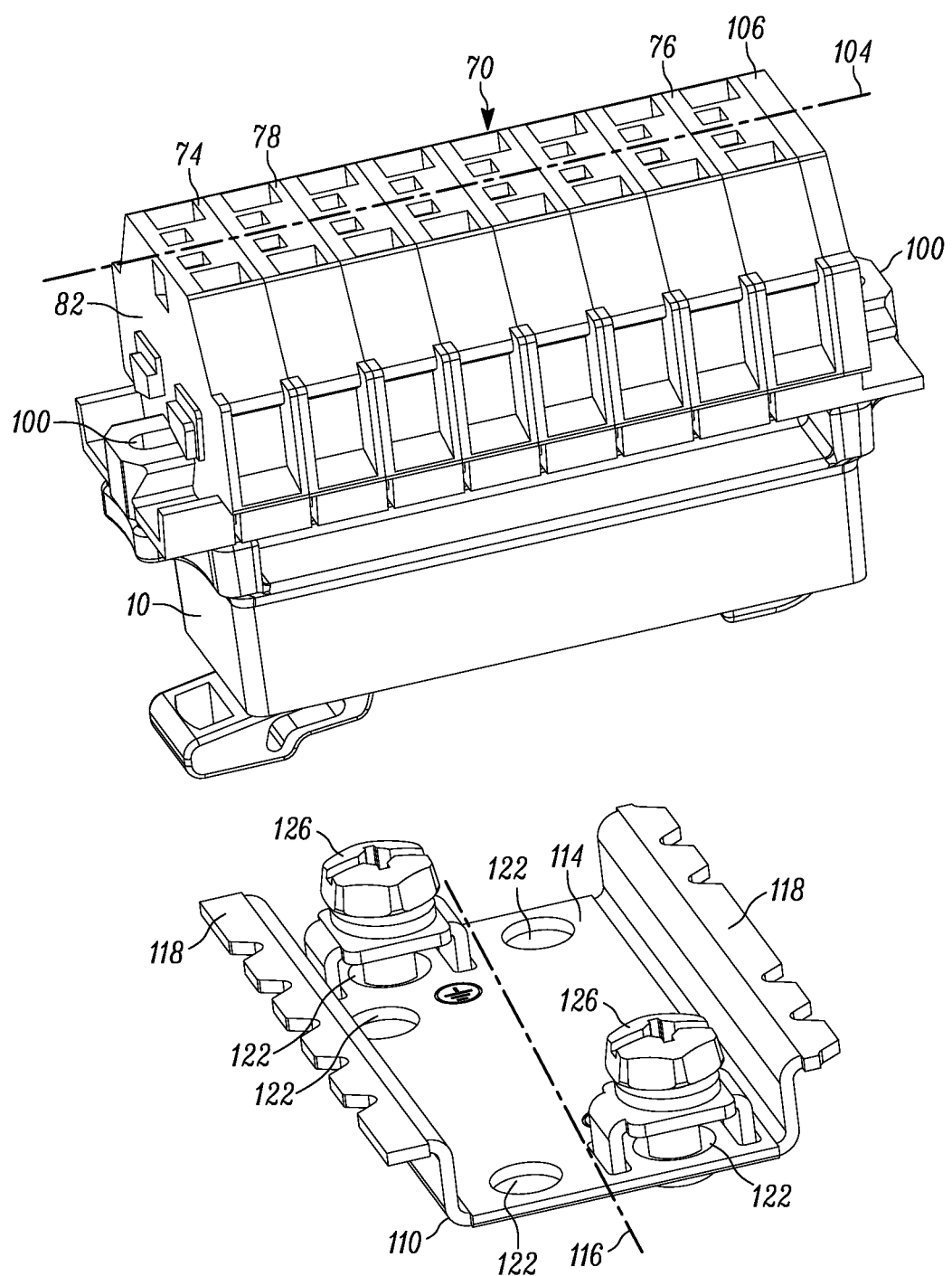
FIG. 5 is an exploded view of a terminal block mounting assembly.
Figure 6A:
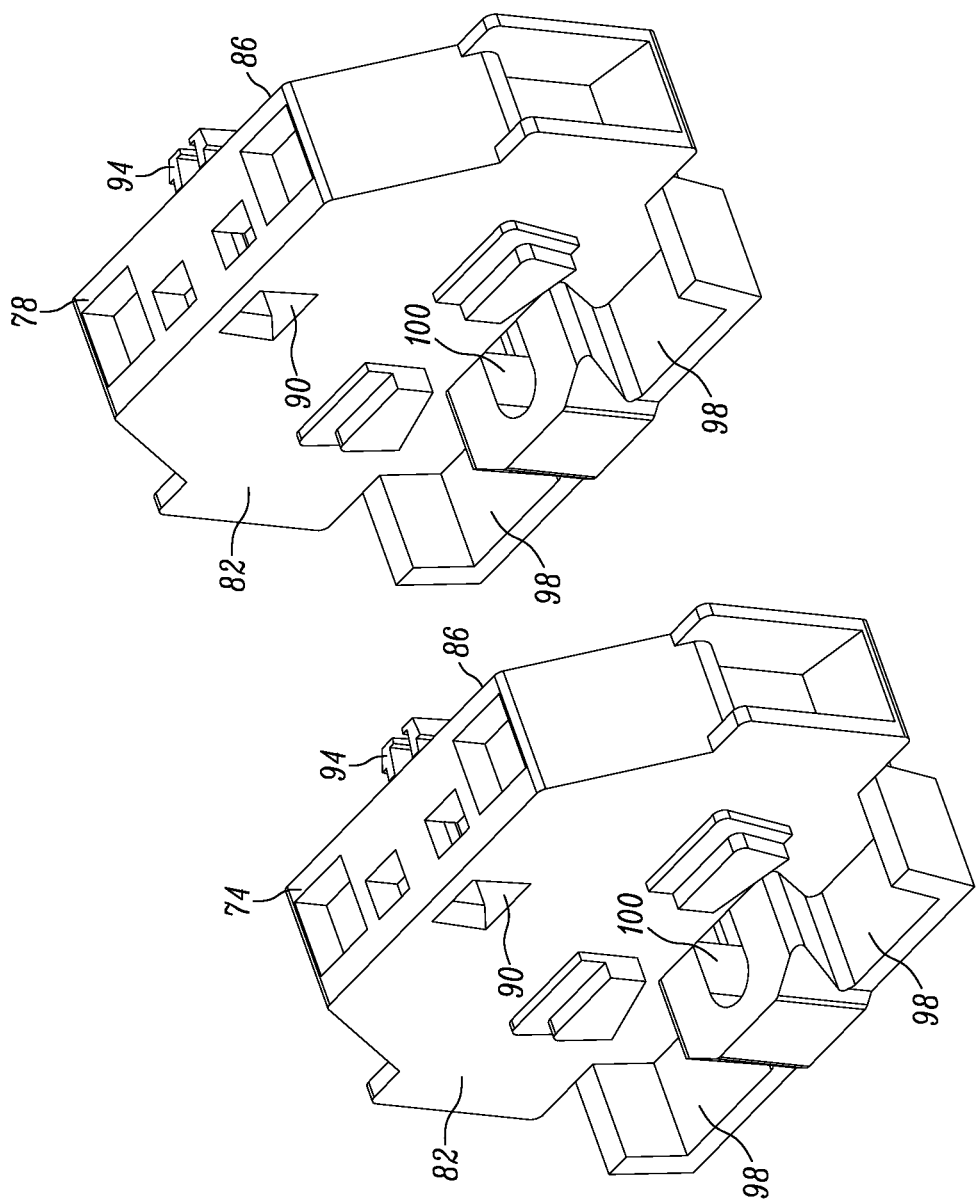
FIG. 6A is a perspective view of a first terminal block and a second terminal block.
Figure 6B:
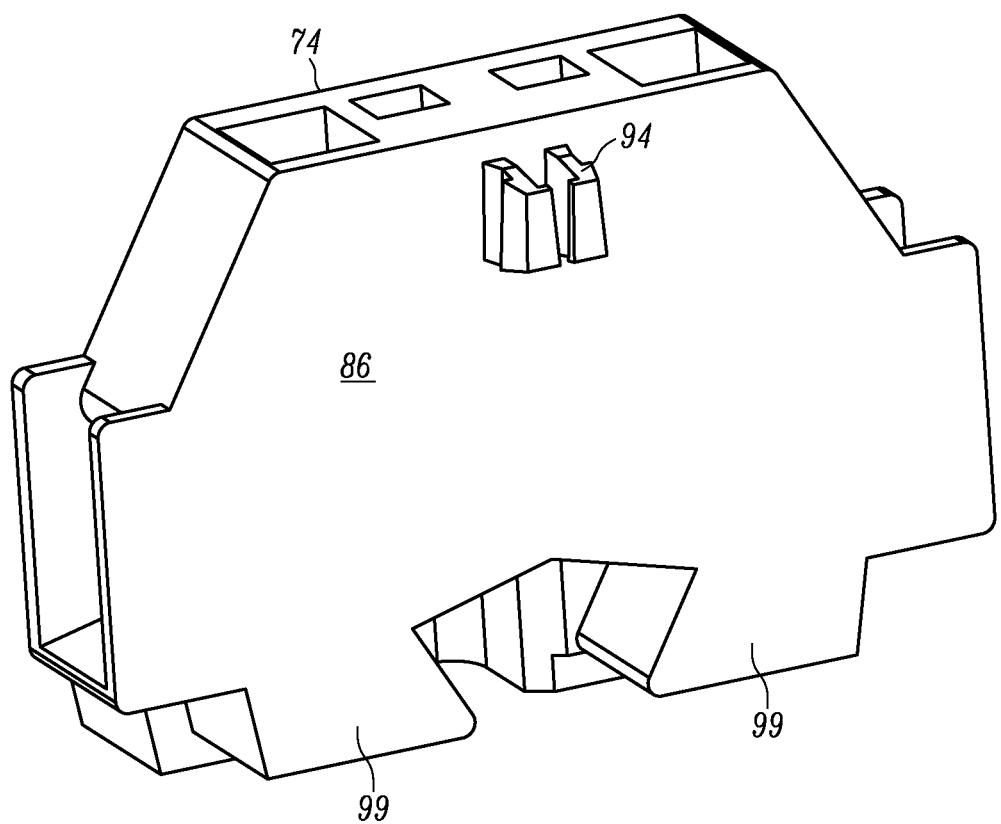
FIG. 6B is an additional perspective view of the first terminal block of FIG. 6A.

FIG. 5 shows the bracket 10 coupled to an electrical or terminal block assembly 70. The terminal block assembly 70 includes at least a first terminal block 74 and a second terminal block 78. The first terminal block 74 is adjacent to the second terminal block 78. As shown in FIGS. 6A and 6B, the first terminal block 74 and the second terminal block 78 each include a first mating surface 82 and a second mating surface 86. The first mating surface 82, of both the first terminal block 74 and the second terminal block 78, includes a female mating piece 90. Additionally, the first mating surface 82 includes a receiving portion 98. The receiving portion 98 includes a passageway 100. The second mating surface 86, of both the first terminal block 74 and the second terminal block 78, includes a male mating piece 94. The second mating surface 86 also includes an inserting portion 99 (FIG. 6B). In the illustrated embodiment, the first terminal block 74 is positioned adjacent the second terminal block 78, and the first mating surface 82 of the second terminal block 78 abuts the second mating surface 86 of the first terminal block 74. When these mating surfaces 82, 86 abut one another, the male mating piece 94 and the inserting portion 99 of the first terminal block 74 mate with the female mating piece 90 and the receiving portion 98 respectively. In other embodiments (not shown), the first terminal block 74 and the second terminal block 78 can be coupled together by fasteners, adhesives, or other coupling means. Additionally, in other embodiments, other types of terminal blocks can be used that do not require the terminal blocks to couple together.

Returning to FIG. 5, the terminal block assembly 70 is coupled to the upper surface 14 (FIG. 1) of the bracket 10. In the illustrated embodiment, a first fastener and a second fastener (e.g., screw, nail, etc.—not shown) couple the terminal block assembly 70 to the bracket 10. The fastener is inserted through the passageway 100 and into either the first aperture 22 or the second aperture 26 (FIG. 1). The terminal block assembly 70 can include any number of terminal blocks 74. In the illustrated embodiment, the terminal block assembly 70 includes a plurality of terminal blocks such that the terminal block assembly 70 spans a length of the upper surface 14. The adjacent terminal blocks are coupled to each other along a coupling direction 104. In the present embodiment, an end block 106 is coupled to a terminal block 76 such that the terminal block assembly 70 includes a first mating surface 82 (FIG. 7) on each end surface of the terminal block assembly 70. A second fastener (not shown) can be inserted into a passageway 100 on the end block and through the second aperture 26. In other embodiments, a single terminal block 74 can be coupled to the upper surface 14 of the bracket 10. Also, the terminal blocks 74 can also be coupled to the upper surface 14 by other coupling means, like adhesives.

The bracket 10 is coupled to a rail 110. In the embodiment shown, the rail 110 is a TS 35 DIN rail. In other embodiments, the rail 110 may be another type of DIN rail, such as the TS 15 (FIG. 11) and the TS 32 (FIG. 12). In still other embodiments, other types of rails can be used. In the illustrated embodiment, the rail 110 includes a first rail surface 114 and two rail projections 118. The first rail surface 114 extends along a rail axis 116. The two rail projections 118 extend out and away from the first rail surface 114. The first rail surface includes a plurality of holes 122. A rail fastening member 126 is inserted through one of the plurality of holes 122 in order to secure the rail to another member. The rail fastening member 126 can be a screw, a nail, or any other fastening member.

Figure 7:
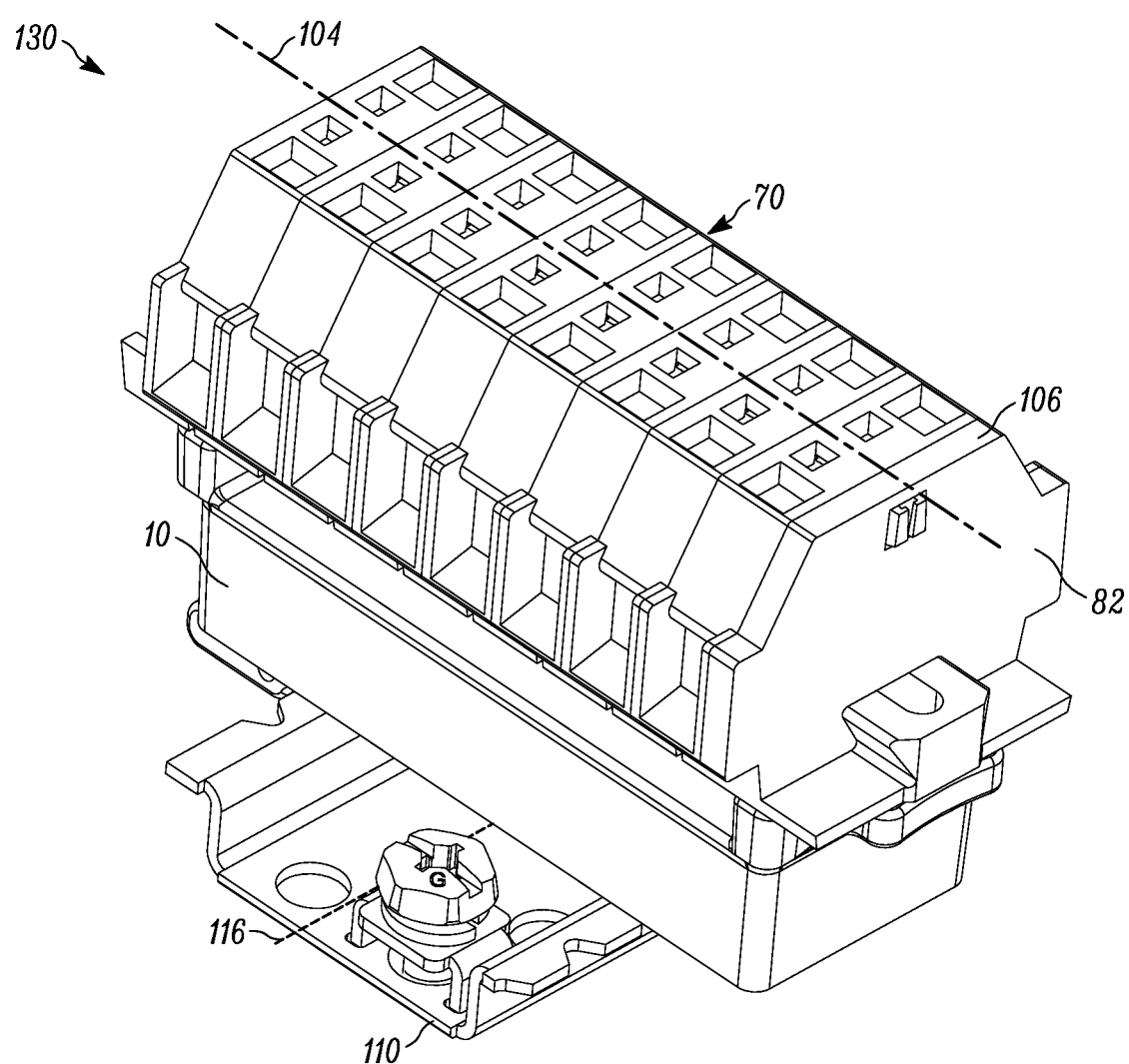
FIG. 7 is a perspective view of the terminal block mounting assembly of FIG. 5.

FIG. 7 shows the terminal block assembly 70 coupled to the bracket 10, and the bracket 10 coupled to the rail 110. The terminal block assembly 70, the bracket 10, and the rail 110 coupled together form a terminal block mounting assembly 130. In the illustrated embodiment, when the bracket 10 is coupled to the rail 110, the bracket 10 is oriented perpendicularly to the rail axis 116. When the terminal block assembly 70 is coupled to the bracket 10, the coupling direction 104 is perpendicular to the rail axis 116.

Figure 8:
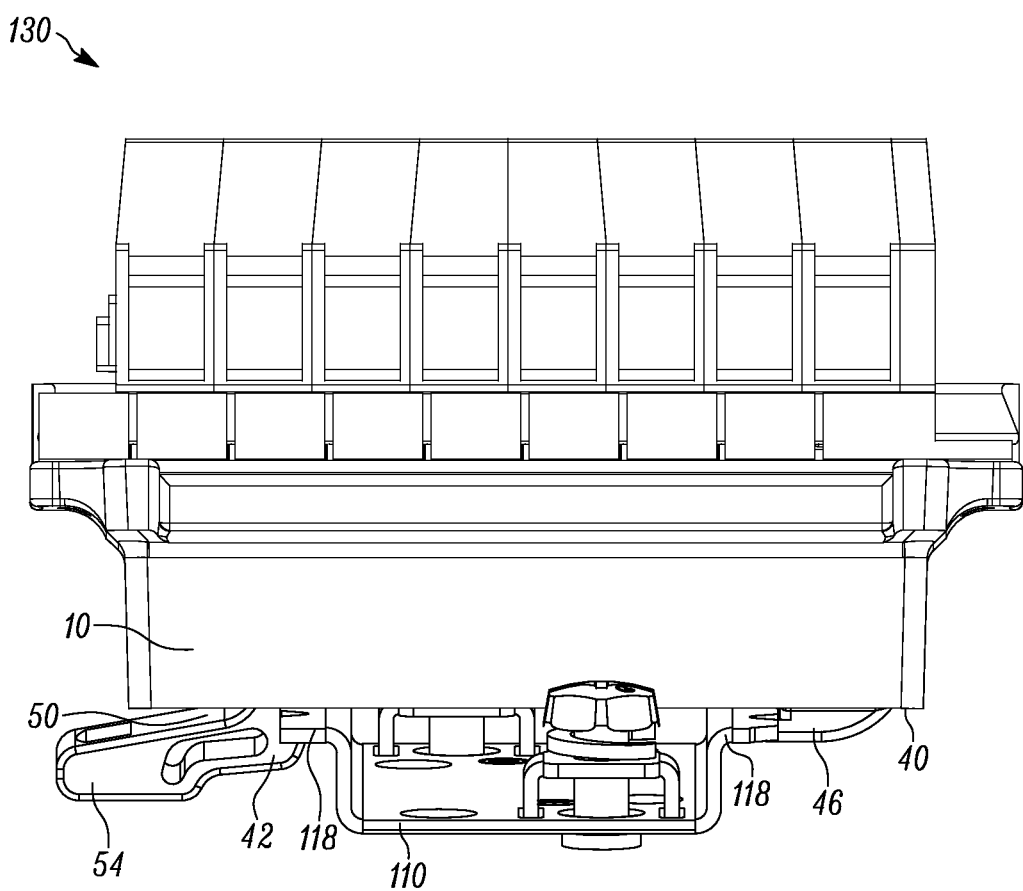
FIG. 8 is a front view of the terminal block mounting assembly of FIG. 5.

Referring now to FIG. 8, to couple the bracket 10 to the rail 110, the first securing member 42 and the second securing member 46 each contact one of the two rail projections 118. Specifically, the first securing surface 62 and the second securing surface 66 (FIG. 3) each contact a bottom surface of one of the two rail projections 118.

Figure 9:
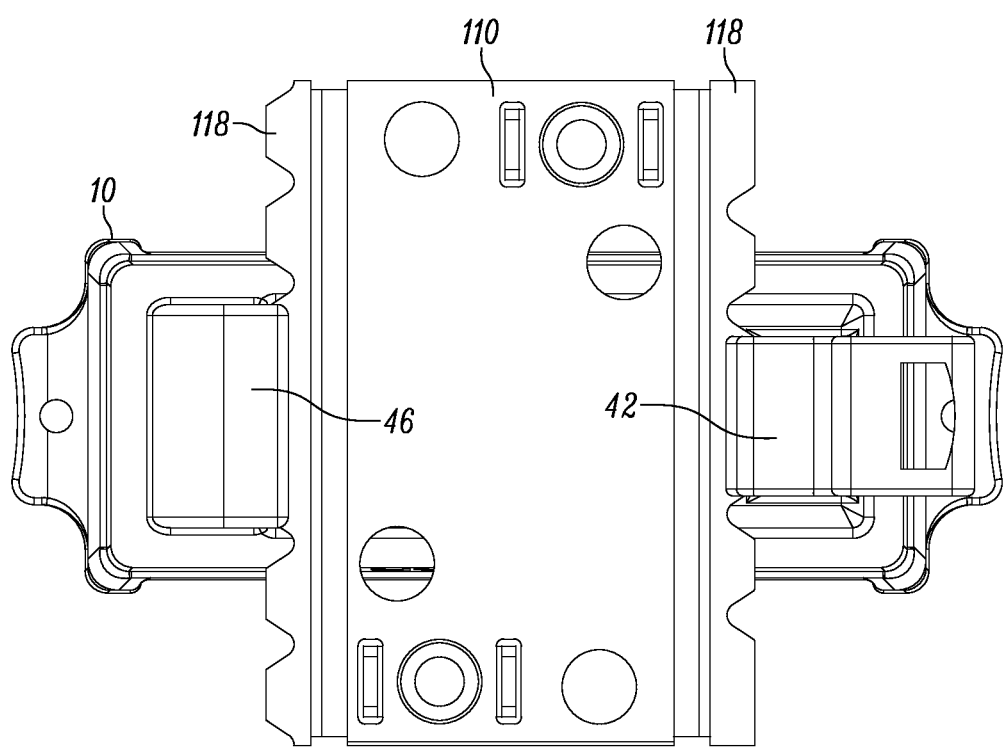
FIG. 9 is a bottom view of the electrical block mounting assembly of FIG. 5.

As shown in FIG. 9, the L-shaped section 47 of the first securing member 42 and L-shaped section 47 of the second securing member 46 each contact a bottom surface of one of the two rail projections 118. This couples the bracket 10 to the rail 110, and prevents the bracket 110 from separating from the rail 110.

Figure 10:
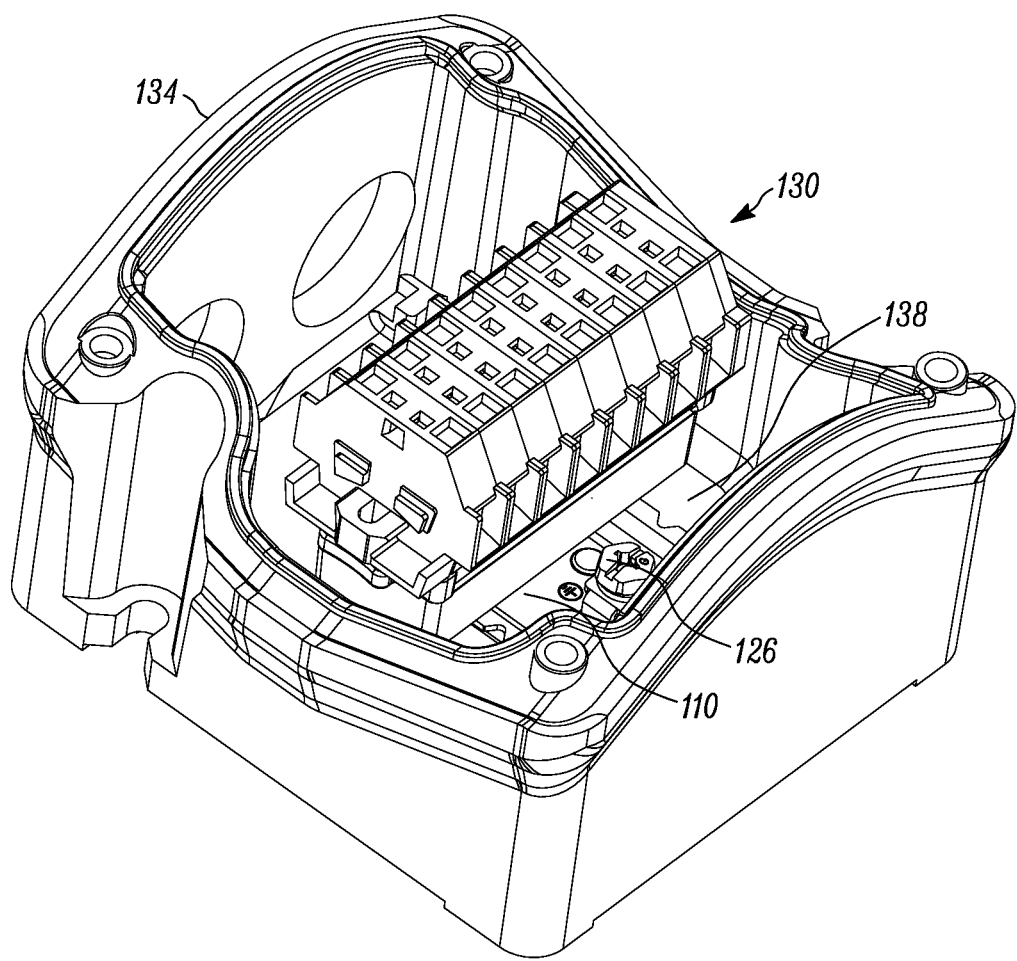
FIG. 10 is a perspective view of an enclosure and the terminal block mounting assembly of FIG. 5.

FIG. 10 shows the terminal block mounting assembly 130 and an enclosure or housing 134. In the illustrated embodiment, the terminal block mounting assembly 130 is located inside of the housing 134. The housing 134 is open on at least one side to expose an internal surface 138. The terminal block mounting assembly 130 is secured to the housing 134 by the rail fastening members 126. The rail fastening members 126 extend through the rail 110 into the housing 134 to secure the terminal block mounting assembly 130 to the housing 134.

Returning to FIG. 8, the bracket 10, and terminal block assembly 70 coupled to the bracket 10, can be removed from the rail 110 by moving the projection 54 from its initial position to its release position. The initial position is defined when the first securing surface 62 (FIG. 3) is substantially parallel to the lower surface 18 (FIG. 2). Since the projection 54 is moveable via the arcuate portion 50, the projection 54 can move towards the release position where the third surface 40 of the first securing surface 62 is no longer fully in contact with one of the two rail projections 118. This allows the bracket 10 and terminal block assembly 70 to be removed from the rail 110 as one piece. In some embodiments, the projection 54 can be moved by an actuator (e.g., a screwdriver or other tool—not shown) or manually. The actuator is inserted into the actuator slot 142 (FIG. 2). Once in the actuator slot 142, the actuator exerts a torque on the projection 54 so that it moves via the arcuate portion 50 and releases from the rail 110.

Figure 11:
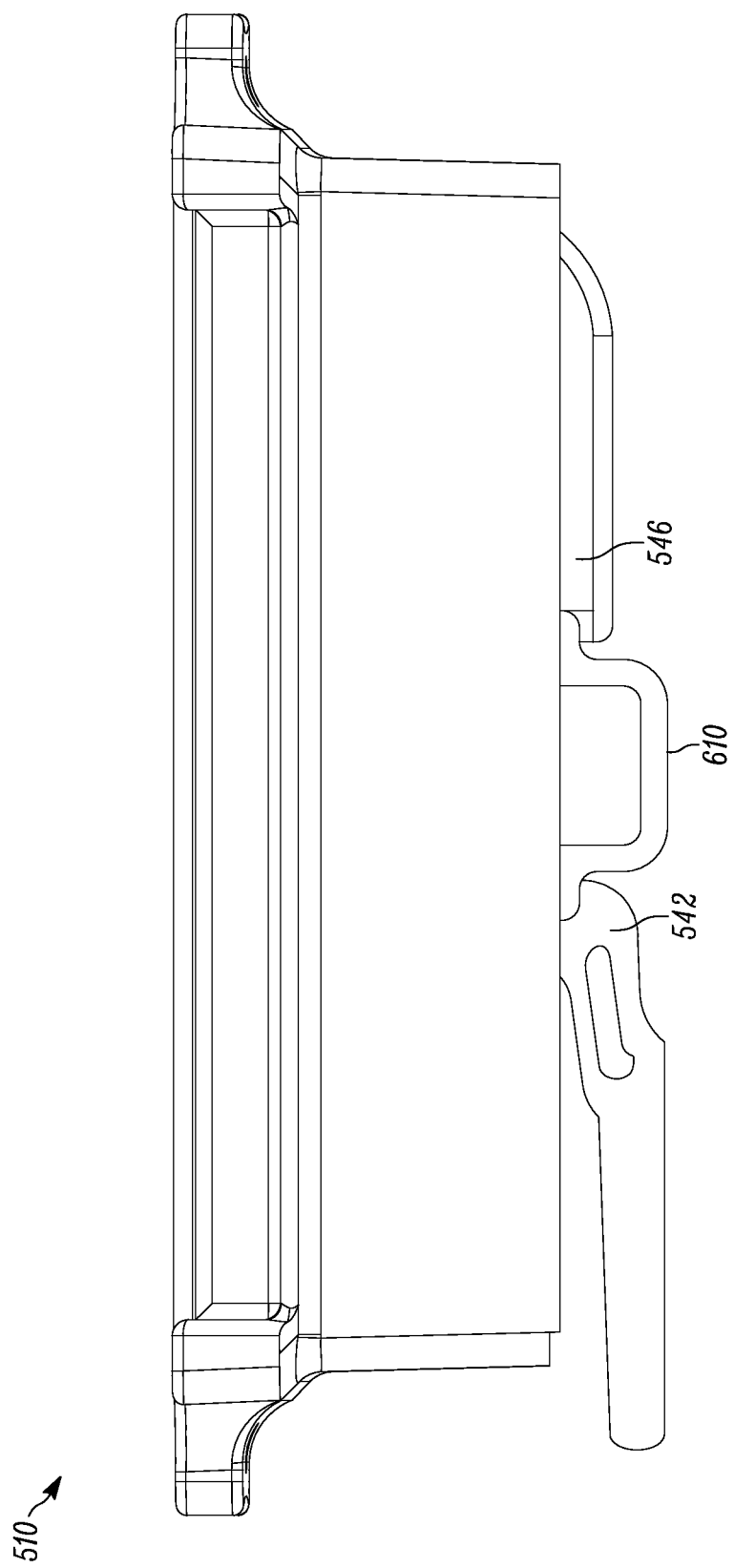
FIG. 11 is a front view of a bracket according to another embodiment.
Figure 12:
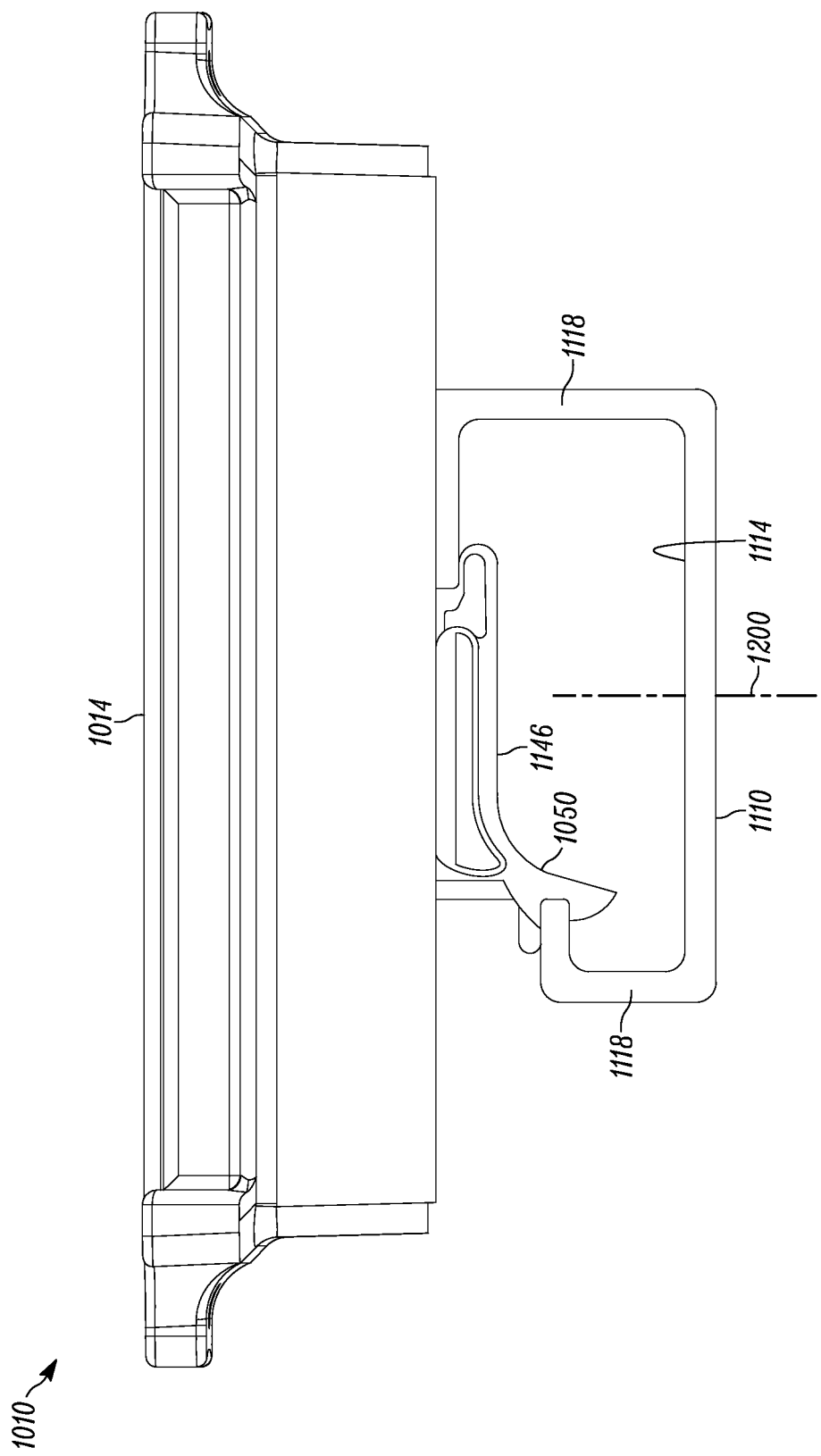
FIG. 12 is a front view of a bracket according to another embodiment.

FIGS. 11 and 12 show other embodiments of the bracket 10. These other embodiments are substantially similar to the exemplary embodiment and at least some differences will be described below. Similar features are indicated with the same reference number plus "500" for the embodiment of FIG. 11, and plus "1000" for the embodiment of FIG. 12.

FIG. 11 shows a first securing member 542 and a second securing member 546. In the illustrated embodiment, the second securing member 546 is larger than the first securing member 542. As compared to the exemplary embodiment, the first securing member 542 is positioned closer to a center of the bracket 510. Additionally, the second securing member 546 extends closer to a center of the bracket 510 than the second securing bracket 46 of the exemplary embodiment (FIG. 3). The first and second securing surfaces (not shown) are equally spaced about the center of the bracket 510. This orientation allows the bracket 510 to couple to narrower rails 610 (e.g., TS 15 DIN rail) than the exemplary bracket 10 (FIG. 8).

In the embodiment of FIG. 12, a first securing surface and the second securing surface (not shown) are positioned on a coupling member 1146. The coupling member 1146 is positioned on the center of and extends away from the second surface (not shown). In the illustrated embodiment, the L-shaped sections 47 extend away from the center of the bracket 1010. The first securing surface and the second securing surface are oriented away from the center of the bracket 1010, enabling the bracket 1010 to couple to a rail 1110 (e.g., TS 32 DIN rail) that has two rail projections 1118, each projecting away from the first rail surface 1114. Each rail projection 1118 also extends inwardly, toward an axis 1200 extending through a center of the rail 1110. The two rail projections 1118 are also non-uniform. Additionally, the arcuate member 1050 is positioned such that it is perpendicular to the second surface while coupled to the rail 1110, and the actuator slot (not shown) is located on the upper surface 1014.

Various different exemplary embodiments are described herein and any feature or component of any embodiment may be combined or replaced with any other feature of component to form an exemplary distribution block.

The foregoing detailed description of the certain exemplary embodiments has been provided for the purpose of explaining the principles of the disclosure and its practical application, thereby enabling others skilled in the art to understand various embodiments and with various modifications as are suited to the particular use contemplated. This description is not necessarily intended to be exhaustive or to limit the disclosure to the precise embodiments disclosed. Any of the embodiments and/or elements disclosed herein may be combined with one another to form various additional embodiments not specifically disclosed. Accordingly, additional embodiments are possible and are intended to be encompassed within this specification and the scope of the exemplary claims. The specification describes specific examples to accomplish a more general goal that may be accomplished in another way.

As used in this application, the terms "front," "rear," "upper," "lower," "upwardly," "downwardly," and other orientational descriptors are intended to facilitate the description of the exemplary embodiments, and are not intended to limit the structure of the exemplary embodiments to any particular position or orientation. Terms of degree, such as "substantially" or "approximately" are understood by those of ordinary skill to refer to reasonable ranges outside of the given value, for example, general tolerances associated with manufacturing, assembly, and use of the described embodiments.

The invention claimed is:

1. An electrical block mounting assembly comprising:
   a bracket including,
      a first surface and a second surface opposite the first surface, and
      a first securing member and a second securing member coupled to the second surface;
   an electrical block assembly coupled to the bracket, the electrical block assembly including a plurality of electrical blocks aligned with one another along a coupling direction; and
   a rail extending along a rail axis, the rail coupled to the bracket by the first securing member and the second securing member such that the coupling direction is orthogonal to the rail axis.

2. The electrical block mounting assembly of claim 1, wherein the first securing member includes a projection.

3. The electrical block mounting assembly of claim 1, wherein the first surface further includes a first aperture and a second aperture.

4. The electrical block mounting assembly of claim 3, further comprising a first fastening member and a second fastening member, the first fastening member extending through the electrical block assembly and the first aperture, and the second fastening member extending through the electrical block assembly and the second aperture to secure the electrical block assembly to the bracket.

5. The electrical block mounting assembly of claim 1, wherein the first surface is substantially flat and rectangular.

6. The electrical block mounting assembly of claim 1, further comprising an enclosure, the rail fastened to the enclosure by a fastener.

7. The electrical block mounting assembly of claim 1, wherein the first securing member and the second securing member are non-uniform.

8. A bracket for mounting an electrical block mounting assembly, the electrical block mounting assembly including a first terminal block and a second terminal block, the first terminal block and the second terminal block being connected along a connection direction, and a rail, the first terminal block and the second terminal block coupled to the rail such that the connection direction is orthogonal to the rail, the bracket comprising:
   a first surface configured to couple to the first terminal block and the second terminal block;
   a second surface opposite the first surface; and
   a first securing member and a second securing member coupled to the second surface, the first securing member including a projection, the projection moveable relative to the second surface, the first securing member and the second securing member configured to couple to the rail, the projection including an actuator slot configured to receive a tool.

9. The bracket of claim 8, wherein the first surface and the second surface are substantially rectangular.

10. The bracket of claim 8, wherein the projection extends past an outer edge of the second surface.

11. The bracket of claim 8, wherein the projection is moveable between an initial position configured to secure the bracket to the rail, and a releasing position configured to decouple the bracket from the rail.

12. The bracket of claim 11, wherein the projection is movable to the releasing position via an arcuate portion, the projection proximate the second surface in the releasing position.

13. The bracket of claim 8, further comprising a first aperture and a second aperture on the first surface.

14. The bracket of claim 13, further comprising a first fastening member and a second fastening member, the first fastening member extending through the electrical block assembly and the first aperture and the second fastening member extending through the electrical block assembly and the second aperture to secure the electrical block assembly to the bracket.

15. The bracket of claim 8, wherein the first surface includes a first section and a second section, the first section has a lesser width than the second section, and a center of the first section is offset from a center of the second section along the connection direction.

16. A bracket for mounting an electrical block mounting assembly, the electrical block mounting assembly including a first terminal block and a second terminal block, the first terminal block and the second terminal block being connected along a connection direction, and a rail, the first terminal block and the second terminal block coupled to the rail such that the connection direction is orthogonal to the rail, the bracket comprising:
   a first surface configured to couple to the first terminal block and the second terminal block;
   a second surface opposite the first surface; and
   a first securing member and a second securing member coupled to the second surface, the securing members are L-shaped and each includes a securing surface, and the first securing member includes an arcuate portion configured to facilitate bending of the first securing member to move the securing surface of the first securing member.

17. The bracket of claim 16, wherein the arcuate member is formed with a projection, the projection is configured to facilitate bending the first securing member.

18. The bracket of claim 16, wherein the first securing surface and the second securing surface are on the same plane.

19. The bracket of claim 16, wherein the securing members are oriented away from a center of the second surface.

* * * * *